(12) United States Patent
Trantham et al.

(10) Patent No.: US 9,892,798 B2
(45) Date of Patent: Feb. 13, 2018

(54) DATA PROTECTION FOR UNEXPECTED POWER LOSS

(71) Applicant: Seagate Technology LLC, Cupertino, CA (US)

(72) Inventors: Jon Trantham, Chanhassen, MN (US); Michael Joseph Steiner, St. Paul, MN (US); Antoine Khoueir, Edina, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 49 days.

(21) Appl. No.: 14/616,424

(22) Filed: Feb. 6, 2015

(65) Prior Publication Data

US 2015/0155050 A1 Jun. 4, 2015

Related U.S. Application Data

(63) Continuation-in-part of application No. 13/761,965, filed on Feb. 7, 2013, now abandoned, and a continuation-in-part of application No. 13/610,433, filed on Sep. 11, 2012, now Pat. No. 9,001,578.

(51) Int. Cl.
*G11C 16/34* (2006.01)
*G11C 5/14* (2006.01)
*G11C 11/56* (2006.01)
*G11C 16/14* (2006.01)

(52) U.S. Cl.
CPC .......... *G11C 16/3418* (2013.01); *G11C 5/143* (2013.01); *G11C 11/5621* (2013.01); *G11C 16/14* (2013.01); *G11C 16/3409* (2013.01)

(58) Field of Classification Search
CPC .. G11C 16/3404; G11C 16/3409; G11C 16/14
USPC ........................................ 365/185.03, 185.33
See application file for complete search history.

(56) References Cited

U.S. PATENT DOCUMENTS

| | | | |
|---|---|---|---|
| 5,930,174 A | 7/1999 | Chen et al. | |
| 7,702,989 B2 | 4/2010 | Graef et al. | |
| 7,835,194 B2 | 11/2010 | Aritome | |
| 8,076,709 B2 | 12/2011 | Ishimaru et al. | |

(Continued)

FOREIGN PATENT DOCUMENTS

| | | |
|---|---|---|
| JP | 2007241576 | 9/2007 |
| JP | 2007287207 | 11/2007 |

(Continued)

OTHER PUBLICATIONS

Office Action from Korean Application No. 10-2014-0012581 dated Jan. 27, 2015, 5 pages.

(Continued)

*Primary Examiner* — Jason Lappas
(74) *Attorney, Agent, or Firm* — Hollingsworth Davis, LLC

(57) ABSTRACT

A data storage device receives a write data command and data. The data is stored in a buffer of the data storage device. The data storage device issues a command complete status indication. After the command complete status indication is issued, the data are stored in a primary memory of the data storage device. The primary memory comprises a first type of non-volatile memory and the buffer comprises a second type of non-volatile memory that is different from the first type of non-volatile memory.

20 Claims, 5 Drawing Sheets

(56) References Cited

U.S. PATENT DOCUMENTS

| | | |
|---|---|---|
| 8,099,437 B2 | 1/2012 | Shapiro |
| 2006/0274566 A1 | 12/2006 | Takashima et al. |
| 2007/0214309 A1 | 9/2007 | Matsuura et al. |
| 2007/0242527 A1 | 10/2007 | Shibata |
| 2008/0291737 A1 | 11/2008 | Moon et al. |
| 2010/0106896 A1 | 4/2010 | Bildgen et al. |
| 2011/0093650 A1 | 4/2011 | Kwon et al. |
| 2011/0099325 A1 | 4/2011 | Roh et al. |
| 2011/0176362 A1 | 7/2011 | Shibata et al. |
| 2012/0246392 A1 | 9/2012 | Cheon |
| 2013/0232291 A1* | 9/2013 | Patapoutian ........ G06F 12/0246 711/103 |
| 2013/0326116 A1* | 12/2013 | Goss ................... G06F 12/0871 711/103 |
| 2014/0071751 A1 | 3/2014 | Kim et al. |
| 2014/0219021 A1 | 8/2014 | Trantham et al. |

FOREIGN PATENT DOCUMENTS

| | | |
|---|---|---|
| JP | 2009181314 | 8/2009 |
| JP | 2010157133 | 7/2010 |
| KR | 10-2012-0108339 | 10/2012 |

OTHER PUBLICATIONS

File History for U.S. Appl. No. 13/610,433.
File History for U.S. Appl. No. 13/761,965.
Office Action from Japanese Application No. 2014-021409 dated May 7, 2015, 4 pages.
Office Action dated Dec. 13, 2016 from Japanese Application No. 2014-021409, 7 pages.
Office Action dated Jan. 10, 2017 from Chinese Application No. 201410045201.3, 11 pages.

\* cited by examiner

DATA PROTECTION FOR UNEXPECTED POWER LOSS

CROSS-REFERENCE TO RELATED APPLICATIONS

This application is a continuation-in-part of U.S. Ser. No. 13/761,965 filed Feb. 7, 2013, and is a continuation-in-part of U.S. Ser. No. 13/610,433, filed Sep. 11, 2012, which are incorporated herein by reference in their entireties.

SUMMARY

Paragraph 1. A method described herein includes:
receiving, in a data storage device, a write data command and data;
storing the data in a buffer of the storage device;
after storing the data in the buffer, issuing a command complete status indication; and
after issuing the command complete status indication, storing the data in a primary memory of the storage device, wherein the primary memory comprises a first type of non-volatile memory, the buffer comprises a second type of non-volatile memory that is different from the first type of non-volatile memory.

Paragraph 2. The method described in paragraph 1, wherein the second type of non-volatile memory has faster access time than the first type of non-volatile memory.

Paragraph 3. The method described in any of paragraphs 1 through 2, wherein:
storing the data in the primary memory comprises storing the data in flash memory; and
storing the data in the buffer comprises storing the data in one or more of STRAM, PCRAM, RRAM, and NVSRAM.

Paragraph 4. The method described in any of paragraphs 1 through 3, further comprising:
storing mapping metadata in the buffer, the mapping metadata including mapping information between the logical block addresses of the data and a physical location of the data in the primary memory; and
after issuing the command complete status indication, storing the mapping metadata in the primary memory.

Paragraph 5. The method described in any of paragraphs 1 through 4, further comprising:
accumulating data from multiple write data commands in the buffer until a threshold amount of data has been accumulated in the buffer; and
after the threshold amount of data has been accumulated in the buffer, storing accumulated data in the primary memory.

Paragraph 6. The method described in any of paragraphs 1 through 5, wherein: the primary memory comprises flash memory; and
the threshold amount of accumulated data is one logical page of data.

Paragraph 7. The method described in any of paragraphs 1 through 5, wherein:
The method described in of paragraph 5 wherein:
the primary memory comprises flash memory; and
the threshold amount of accumulated data is one physical page of data.

Paragraph 8. The method described in any of the paragraphs 1 through 5, wherein the primary memory comprises multi-level flash memory and the threshold amount of accumulated data is sufficient to allow at least one page of accumulated data to be stored in the flash memory; and further comprising:
reading one or more pages from each physical page in the at least one block of the primary memory where the at least one page is to be stored;
storing the other pages in the buffer; and
after the at least one page has been accumulated, storing the page and the other pages in the physical page of the primary memory.

Paragraph 9. The method described in paragraph 8, wherein reading the other pages occurs before accumulating the page.

Paragraph 10. The method of described in paragraph 8, wherein reading the other pages occurs during accumulating the page.

Paragraph 11. The method described in any of paragraphs 1 through 10, further comprising:
counting numbers of times regions of logical blocks within the data storage device have been written;
accumulating data from multiple write data commands in the buffer; and
determining if regions of logical blocks are infrequently-written or frequently-written based on the numbers; and
storing data for the infrequently-written regions of logical blocks into the primary memory before storing data for the frequently-written regions of logical blocks.

Paragraph 12. The method of described in any of paragraphs 1 through 11, further comprising updating metadata that provides status of the write operation.

Paragraph 13. The method described in paragraph 12, wherein updating the metadata comprises updating the metadata to indicate a write operation is in progress after the write data command is received.

Paragraph 14. The method described in paragraph 12, wherein updating the metadata comprises updating the metadata to indicate that the data have been received.

Paragraph 15. The method described in paragraph 12, wherein updating the metadata comprise updating the metadata to indicate that the write operation is complete after storing the data in the primary memory.

Paragraph 16. A device, comprising:
an interface configured to receive a write data command and data;
a primary memory comprising a first type of non-volatile memory;
a buffer comprising a second type of non-volatile memory different from the first type of non-volatile memory; and
a controller configured to:
cause the data to be stored in the buffer;
after the data are stored in the buffer, issue a command complete status indication indicating the write data command is complete; and
after the command complete status indication is issued, cause the data to be stored in the primary memory.

Paragraph 17. The device described in paragraph 16, wherein the second memory type comprises one or more of non-volatile static random-access memory (NVSRAM), phase-change memory (PCM), resistive random-access memory (RRAM), spin-torque RAM (STRAM), and magnetic RAM (MRAM).

Paragraph 18. The device described in any of paragraphs 16 through 17, wherein the device comprises a solid state drive and the first memory type comprises flash memory.

Paragraph 19. The device described in any of paragraphs 16 through 18, wherein the device comprises a hybrid drive.

Paragraph 20. The device described in any of paragraphs 16 through 19 wherein the controller is configured to pre-compensate for write disturb effects when the data are stored in the primary memory.

DETAILED DESCRIPTION

Figure 1:
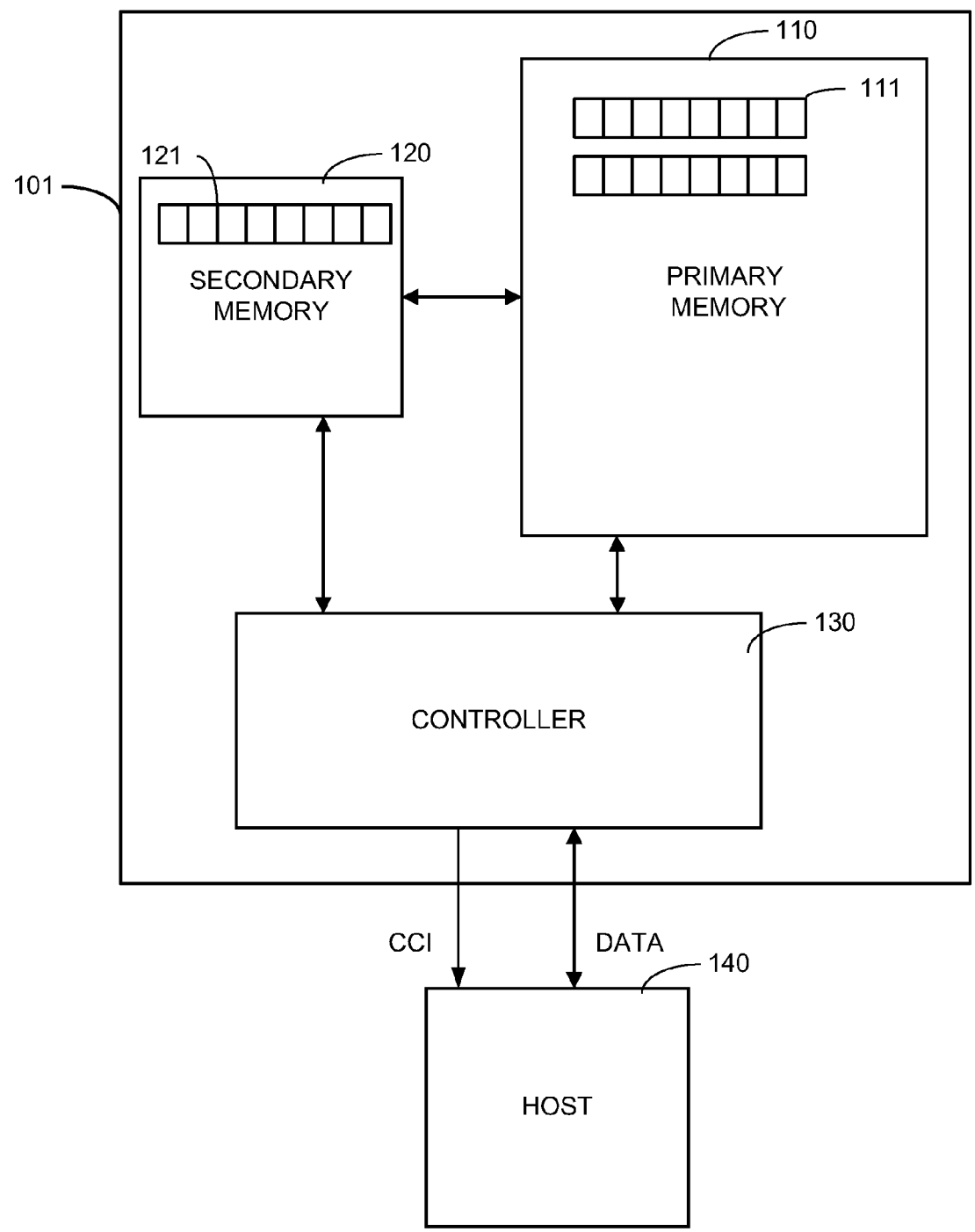
FIG. 1 is a block diagram of a system that includes a data storage device according to embodiments discussed herein.

On a write operation, the successful reception and storage of data sent to a data storage device, such as a hard disk drive, a solid state drive or hybrid disk drive is typically acknowledged to the sending device, e.g., the host, via a "command complete" status message indication (CCI). For example, a Serial-Attached-SCSI hard disk drive with volatile write caching disabled will typically send such a message on a write command operation after data are written to the media. To maintain data integrity, it is desirable that data sent for storage will not be lost in the event that the data storage device suddenly loses supplied power. However, to provide optimal system throughput, it can be beneficial to return a CCI from the data storage device to the host even through the data sent from the host has not yet been stored in its final memory location in the data storage device. Preemptively sending the CCI before the data are stored in their final memory locations can be beneficial to the performance of both the host and the data storage device. Data are normally kept in the host system until CCI is received from the data storage device in case of a fault within the data storage device. The reception of CCI allows the host system to free its data buffers for new work. For the data storage device, the preemptive sending of CCI potentially allows for additional new commands to be sent by the host system, increasing the possibility for parallel processing of commands and for merging of complementary commands, e.g. sequential operations spanning across command boundaries. However, data integrity may be compromised if a power outage occurs after the CCI is sent to the host but before the data along with any corresponding metadata are saved to non-volatile memory.

Although the technique of returning the CCI prior to the data being stored in its final non-volatile memory location can increase data throughput, this technique and the avoidance of data loss has led to additional electrical energy-storage components e.g. battery backup and/or capacitive energy storage. These additional energy-storage components are designed to maintain backup power for the data storage device that is sufficient to allow a data storage operation to be completed even though a loss of main power occurs while the data are being stored. Incorporating the additional hardware adds to the complexity, cost, and size of the device.

Additional complexity is introduced due to the need to maintain mapping metadata to keep track of where data are stored in the primary memory. In general, data stored in most data storage devices is not directly mapped between its logical address (used by the host) and a physical location in primary storage. Instead, mapping metadata keeps track of the location of logical blocks in the physical locations in primary storage. Accurately maintaining the mapping metadata even in the event of unexpected power loss enhances data integrity of the data storage device. Because mapping metadata are frequently updated, it is helpful to store the mapping metadata in fast, durable memory. Volatile memory such as SRAM or DRAM have the speed and durability characteristics compatible for mapping metadata, but are volatile and lose their contents when power is lost. Storing metadata in slower, less durable, non-volatile memory adds to write amplification and wear on the non-volatile storage components, and reduces performance.

Embodiments described herein incorporate a secondary non-volatile memory with a faster access time and/or higher durability than the primary non-volatile memory. In these embodiments, the secondary non-volatile memory acts as a buffer for the primary non-volatile memory, where the primary non-volatile memory generally serves as the final storage location for user data. In the embodiments discussed herein, the CCI is sent from the data storage device to the host after the data are stored in the secondary non-volatile memory but before the data are stored in the primary memory. Note that the terms "primary memory" and "secondary memory" are used herein to denote differences in memory (e.g., usage, capacity, performance, memory class or type, etc.) and not necessarily order or preference.

In some storage device configurations, the primary memory is solid state memory, such as NAND or NOR flash memory. Flash memory generally refers to electrically erasable and programmable memory based on floating gate FET technology. Flash memory is becoming an increasingly important storage technology and has been used as a primary storage memory in solid state drives (SSDs). Flash memory is also used in conjunction with hard disk (rotating disk) memory in hybrid drives. In some arrangements, where the primary memory is flash or hard disk, the secondary memory may be a non-volatile memory that is faster and/or more durable than flash memory, such as phase change memory (PCM), resistive random access memory (RRAM), spin-torque random access memory (STRAM) and/or non-volatile static random access memory (NVSRAM). PCM and RRAM can be thousands of times more durable than NAND flash (in terms of reprogramming cycles), and are also bit-alterable. STRAM and nvRAM devices have nearly unlimited durability, and are also bit-alterable.

FIG. 1 is a block diagram of a system showing a data storage device 101 and a host 140. The data storage device 101 includes a nonvolatile primary memory 110, e.g., flash, hard disk, or other nonvolatile memory, and a nonvolatile secondary memory 120, e.g., STRAM, PCRAM, RRAM, NVSRAM, or other types of nonvolatile memory. The primary memory 110 typically includes a large number of data storage locations 111 and the secondary memory 120 typically includes fewer data storage locations 121. In many arrangements, the secondary memory 120 has faster access time and/or is more durable than the primary memory. Note that the primary memory may include multiple types of memory, such as flash and hard disk memory used together in a hybrid drive. Similarly, the secondary memory 120 may also use multiple memory types.

The data storage device 101 includes a controller 130 that couples the primary memory 110 that includes a large number of data storage locations, and the secondary memory 120 to the host 140. The controller 130 controls read and write accesses to the primary 110 and secondary 120 memory. For example, the host 140 may issue a write command to the data storage device 101, wherein the write command includes the data to be stored and the logical block addresses (LBAs) of the data. The controller 130 receives the data storage command from the host and controls the secondary memory 120 and the primary memory 110 so that the data sent from the host 140 is stored in a final destination memory location 111 in the primary memory 110. The term "final destination" of the data as used herein refers to the final destination of the data in the context of the data storage command being executed, even though the data stored in the primary memory may not necessarily reside in this final destination permanently and, after execution of the data storage command, may be moved to other memory locations in the primary memory or elsewhere as a result of garbage collection and/or other device operations. As a part of a data storage operation being executed, the controller 130 generates mapping metadata that maps the host LBAs of the data to the physical locations of the data in the primary memory 110 and/or secondary memory 120. Additionally, the controller 130 generates various handshaking signals which are returned to the host 140 and indicate the status of the data storage command, such as the CCI signal indicated in FIG. 1.

Figure 2:
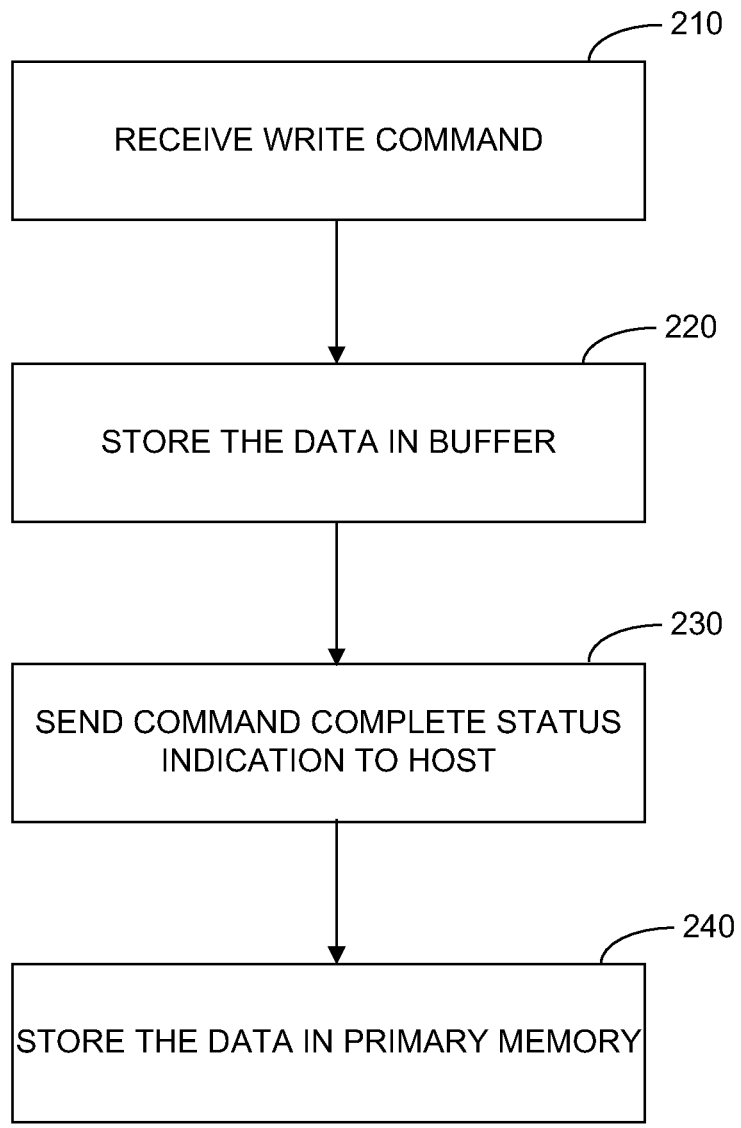
FIG. 2 provides a flow diagram of a process of operating a data storage device to perform a write operation in accordance with some embodiments.

FIG. 2 shows a flow diagram of a process of operating a data storage device according to various embodiments described herein. As previously discussed, the data storage device includes a primary memory and a secondary memory used mostly as a buffer. The primary memory comprises a first type of non-volatile memory and the buffer comprises a second type of non-volatile memory, where the second type of non-volatile memory has higher access speed and/or greater durability than the first type of non-volatile memory. The data storage device receives 210 a write command from a host requesting that data be stored in the data storage device. The data are initially stored 220 in the buffer. After the data are stored in the buffer, the controller sends a CCI command 230 to the host, wherein the CCI command indicates to the host that the data in the write command has been stored. After the CCI command has been sent to the host, the data are stored 240 in the primary memory.

In some arrangements, the data storage device may selectively store data in the buffer. For example, in some cases, the write command may include and/or the controller may determine a priority level for the data in the write data command. If the priority level of the data is below a predetermined threshold priority, the controller may bypass the buffer and may directly store the data in the primary memory. If the priority level of the data is greater than or equal to the threshold priority, the data are first stored in the buffer before being stored in the primary memory. In some cases, it may be desirable to retain some data in the buffer indefinitely. For example, data that is deemed to be more important to the performance of the system, such as data for LBAs that are frequently read, may be kept in the buffer. As another example, data for LBAs that are frequently rewritten may be kept in the buffer in preference to data from LBAs that are rarely rewritten in order to reduce wear or to improve performance. As yet another example, data that are stored elsewhere (duplicated) may have a lower buffer-retention priority than data that are not stored elsewhere. In some cases, user data may be determined to be more important and therefore have a higher priority than other data, such as internal drive logs and journals that are not essential to the device's data integrity.

In some embodiments, the controller counts the number of times regions of logical blocks within the data storage device have been written. Data from multiple write data commands are accumulated in the buffer. The controller determines if regions of logical blocks are infrequently-written or frequently-written based on the numbers counted. The controller causes the buffered data for infrequently written LBA regions to be stored before the buffered data for frequently written LBA regions.

During the write operation illustrated in FIG. 2, the controller can update metadata that records the progress of the write operation. The write operation metadata can be stored in the buffer or in other non-volatile memory, such as non-volatile registers of the controller (if available). For example, the write operation metadata can be updated to indicate information such as: a write operation is in progress, a write operation is complete, the LBAs and/or length of data to be stored, the accumulation of data prior to storing the accumulated data in the primary memory.

In most solid stated drive designs, the logical block addresses (LBAs) used by the host are not directly mapped to the physical locations in the primary memory. The controller uses mapping metadata to keep track of the physical memory locations of the host LBAs. Accurately maintaining the mapping metadata even in the event of unexpected host system power loss helps to ensure the data integrity of the data storage device. To reduce the possibility of losing the mapping metadata during a power disruption, the mapping metadata can be stored in the non-volatile memory, e.g., the non-volatile buffer or other non-volatile registers (if available) of the controller, until the mapping metadata is transferred to the primary memory.

As the write operations are serviced by the controller, the write operation metadata and mapping metadata are usually updated frequently. In some configurations, the non-volatile buffer is used to store write operation metadata and/or mapping metadata. Using the non-volatile buffer protects the metadata from loss in the event of a power disruption. If the buffer has faster access time than the primary memory, frequent updates to the metadata can be performed most expeditiously by using the buffer. If the buffer has more robust durability than the primary memory, the frequent updates to the metadata reduce wear of the primary memory. It can be helpful to perform updates to the metadata atomically, where updating atomically corresponds to updating the metadata in the smallest increments of the write operation possible. If the metadata cannot be incremented atomically, it can be updated in the smallest increments of the write operation that will maintain a risk of data loss less than a predetermined probability. Alternatively or additionally, when the metadata are not able to be updated atomically, semaphores, essentially indicating that an "update is in progress—use alternate copy", can be maintained to track and protect against corruption from power loss while a metadata update is in progress.

Figure 3:
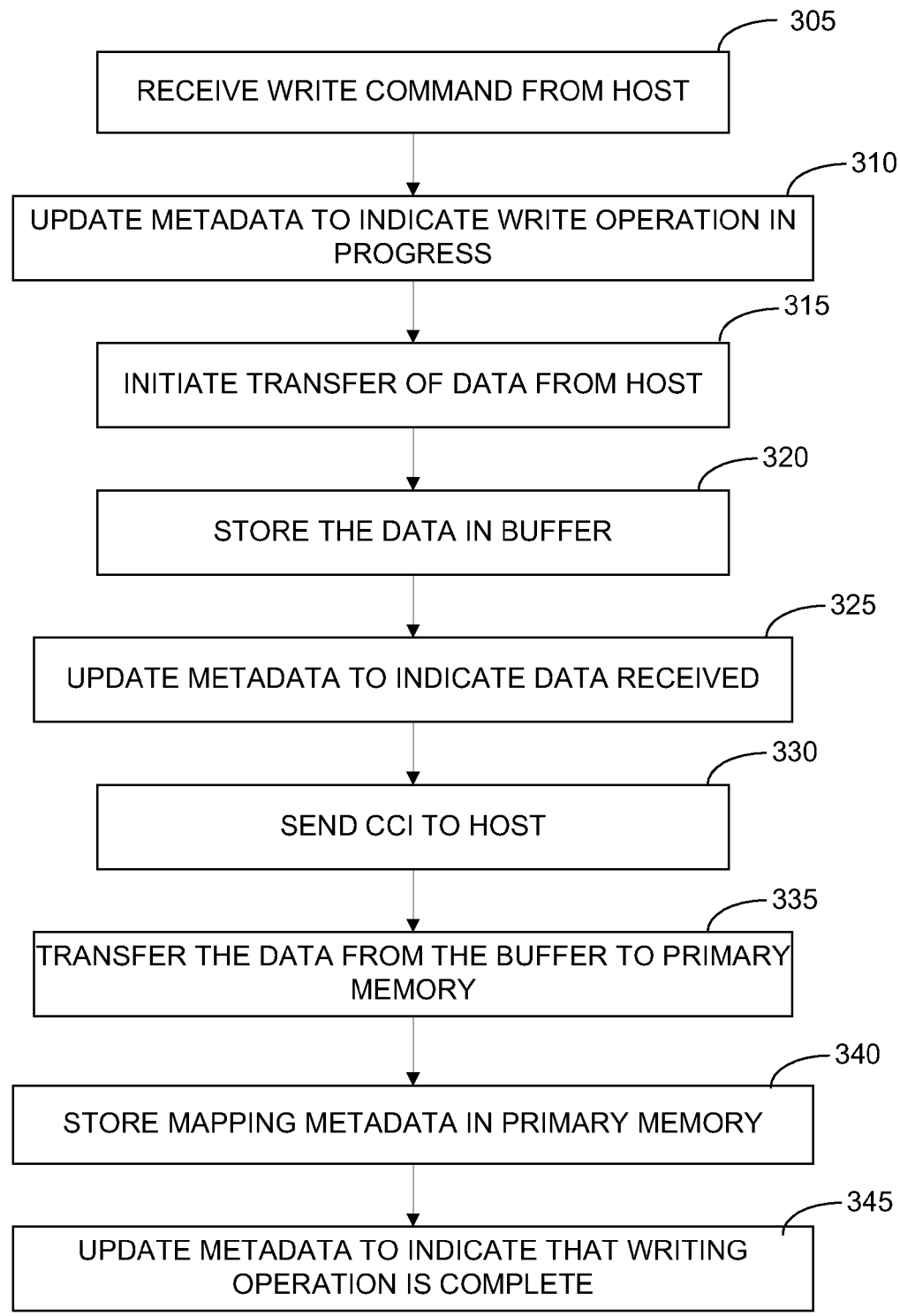
FIG. 3 is flow diagram illustrating a process that includes storing data and updating metadata during a write operation.

FIG. 3 provides a flow diagram illustrating a process that includes storing data and updating metadata during a write operation. According to the process shown in FIG. 3, the controller receives 305 a write command from the host and initiates a write operation. The write operation metadata is optionally updated 310 to indicate that the write operation is in progress. In some cases, the write operation metadata may include additional information about the write operation, such as the current status of the write operation. The data are transferred 315 from the host and the data are stored 320 in the buffer. After the data are stored in the buffer, the write operation metadata are updated 325 to indicate that the data storage device has received the data (and is about to return CCI status to the host). The controller generates and sends 330 a CCI for the write operation to the host. With the data securely stored in the non-volatile buffer, the controller may initiate the transfer 335 of data from the buffer to the primary memory. This transfer 335 is at the discretion of the controller logic. The logic may select to defer storage until later, for example to coalesce the data with other incoming data. The controller may store 340 the mapping metadata to the primary memory. The controller updates 345 the write operation metadata to indicate that the write operation is complete. If the mapping metadata are written to primary memory, the buffer location used to temporarily store the mapping metadata for the memory write operation is no longer needed, and is added to the available buffer memory locations. When the write operation in progress flag is cleared, indicating that the write operation is complete, the buffer locations used or reserved for the write operation are returned to the pool of available buffer locations.

In a multi-level memory, more than one bit of data can be stored in a single cell. For devices that group storage cells into pages, such as what is commonly done in NAND flash devices, multiple logical data pages can be stored in a single physical page of memory. These multiple logical data pages that are stored in a single physical page of memory are referred to herein as companion pages. Using four level memory as an example, each four level memory cell can store two bits of information. In a device that arranges these cells into pages, each physical page of flash memory cells can store two logical (companion) pages. In one configuration, a first logical page (denoted as the lower page) can be stored in the most significant bits (MSBs) of the memory cells of a physical page of memory cells and a second logical page (denoted the upper page) can be stored in the least significant bits (LSBs) of the physical page of memory cells. It is possible to write multi-level data to the physical page of memory cells in several ways. In one scenario, the lower page is stored first by storing the MSBs in the physical memory cells. After the lower page is written, the upper page is later stored to the physical memory cells by further altering the state of the physical memory cells.

Figure 4:
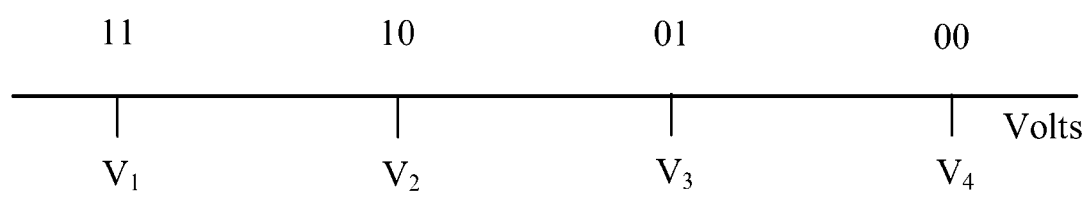
FIG. 4 depicts possible voltage levels that can be used to represent two bits of data in a hypothetical two level memory cell.

Consider the possible voltage levels that can be used to represent two bits of data in a hypothetical two level memory cell illustrated in FIG. 4. In this example, the voltage level V1 corresponds to the two bits of data 11 (binary), the voltage V2 corresponds to the two bits of data 10, the voltage V3 corresponds to 01, and the voltage V4 corresponds to 00. Data YX can be written to the memory cell in a two-step process of writing Y (the MSB) in a first step followed by writing X (the LSB) in a second step. After the first step of writing Y, the voltage level of the memory cell is V1 (if Y=1) or V3 (if Y=0). In the second step, the voltage level of the memory cell remains at V1 (if YX=11) or the voltage level is brought to V2 (if YX=10) or the voltage level remains at V3 (if YX=01) or the voltage level is brought to V4 (if YX=00).

In some scenarios, data can be written to the multi-level memory cell in a single step process. For example, considering the memory cell of FIG. 4, in a single step process, the voltage of the memory cell is brought (or left at) level V1 if YX=11, the voltage level of the memory cell is brought to level V2 if YX=10, the voltage level of the memory cell is brought to level V3 if YX=01, the voltage level of the memory cell is brought to level V4 if YX is 00.

The usage of "voltages levels" to record data in the preceding example is for exemplary purposes. In other examples, the data could be stored and sensed as magnetic states, charge levels, resistance levels, etc. and the technique is still applicable.

When data are written to companion lower and upper pages of a physical memory page in the two step process outlined above, data stored in an lower page of the primary memory can be corrupted when a power loss occurs during the time that a corresponding upper page is being stored in the primary memory. To reduce the possibility of this type of data corruption, when data from a write data command is to be stored in an upper page of the primary memory, the corresponding lower page is read from the primary memory into the buffer to protect against the contents of the lower page being corrupted due to power loss during the upper page programming. Error correction may be performed on the lower page when the lower page is read from the primary memory.

Figure 5:
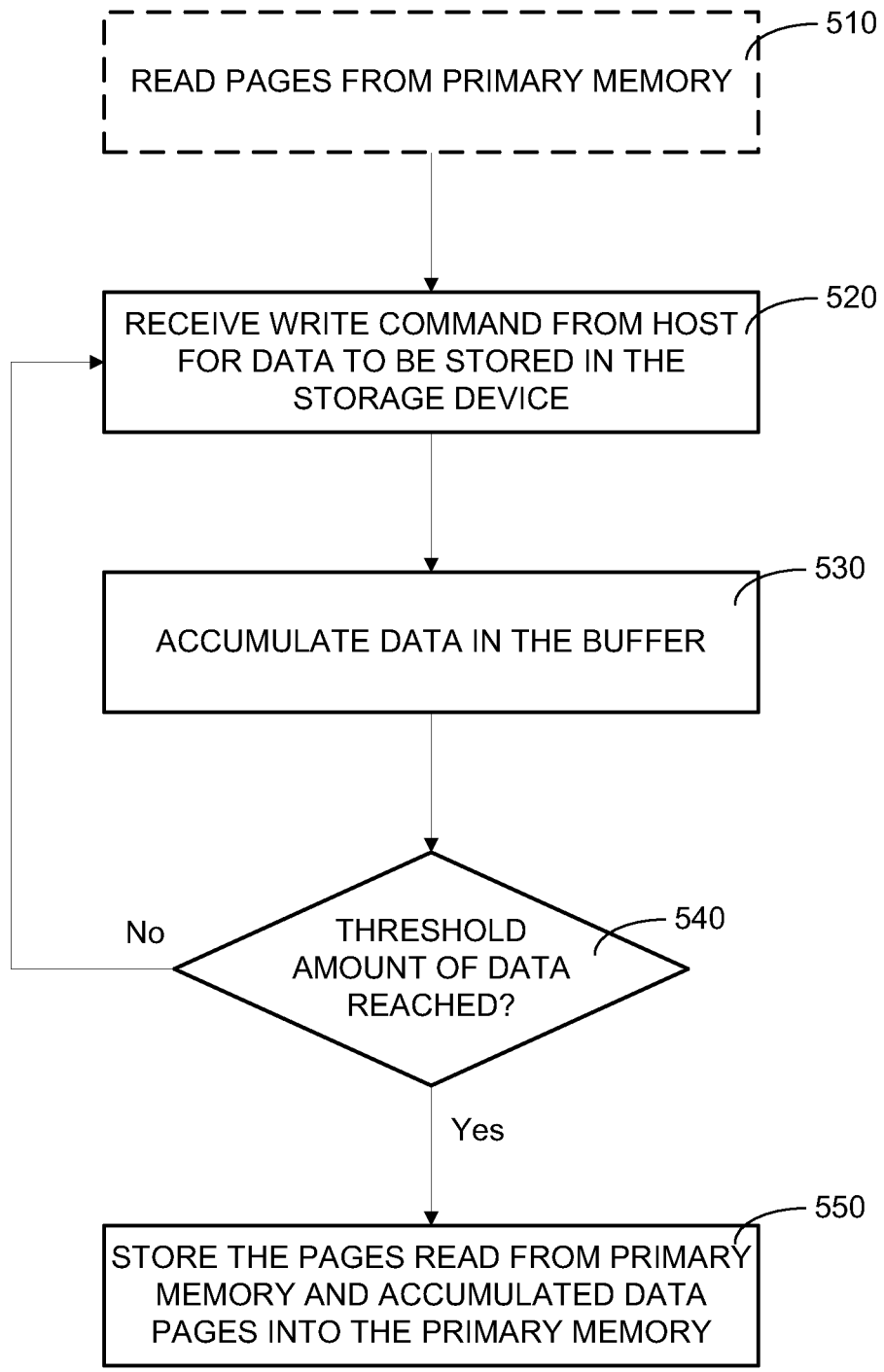
FIG. 5 illustrates a process of accumulating data prior to storing in primary memory in accordance with some embodiments.

In some scenarios, it can be more efficient if a certain amount of data are accumulated in the buffer before the write operation to the primary memory occurs. For example, some types of memory are written in predetermined units, e.g., flash memory is generally written in pages. According to the process of FIG. 5, the data storage device receives 520 a write command from the host and accumulates 530 data from the write commands in the buffer. The data accumulation continues 540 until a threshold amount of data has been accumulated. The threshold amount can correspond to the memory unit of a write operation for the primary memory. If the primary memory is a multi-level memory, data can be accumulated from the write commands until all logical pages (lower, upper, and any intermediate pages) to be stored in each physical page of the primary memory write unit are accumulated.

In some scenarios, before, during, and/or after the data from the write commands are being accumulated in the buffer, the controller may optionally read the companion pages for this accumulated data from the primary memory into the buffer. This optional process is indicated by the dashed box 510. Note that the arrangement of blocks in the flow diagrams provided herein are not meant to imply any particular order of carrying out processes described in the blocks. For example, although the read operation is shown ahead of the reception of write data 520, it could just as well occur simultaneously or after reception of the write data 520. When the desired amount of data is obtained, through accumulation of the data from the write commands and optionally by reading the companion pages from the primary memory, the accumulated data pages and their companion pages are written 550 to the primary memory.

In some embodiments, when multi-level primary memory is used, logical data pages may be written to a physical pages of the primary memory in a writing process that separately writes a lower page, an upper page and any number of intermediate pages to each physical page of the primary memory. Alternatively, the lower, upper, and intermediate pages can be written to a physical page of the primary memory pages in a single step process by directly transitioning each memory cell to the voltage level that corresponds to the multi-bit data stored in the memory cell.

Some types of non-memory, such as flash, experience disturb effects during write operations. For example, the data stored in a memory cell may be changed when a nearby memory cell is written to. When these types of memory are used as the primary memory, the data pages may be written to the primary memory according to a process that reduces these write disturb effects.

As previously discussed, in a two-step process, lower data pages may be written to a physical page first. During the time that the lower page is written, one of its physically adjacent neighbor pages is un-programmed. Later, the companion upper page is programmed. At the time the upper page is programmed, the physically adjacent neighbor page is either unprogrammed or programmed to only one bit per cell (only its lower page is programmed). When the neighbor page is unprogrammed or only partially programmed, the page being programmed is uncompensated for the coupling effects of the charge level of the neighbor page. When the neighbor page is eventually fully programmed, the levels of the previously programmed page can shift. For example, in a NAND flash, the close proximity of storage cell floating gates causes capacitive coupling between the gates of neighboring cells that shifts storage cell levels from their ideal levels.

In some embodiments, the non-volatile buffer described herein can accumulate multiple pages of data and multiple adjacent pages can be programmed simultaneously or in a coordinated way that reduced write disturb effects. According to this process, either prior to or while fully programming a page, its neighbor page is also programmed, but only "softly". In this context, programming "softly" means that the neighbor page is "underprogrammed" to a charge level that approaches its target value, but is enough below its final charge level to allow for possible level-compensation required by its neighbor. The purpose of "softly" programming the neighbor is to impart enough of the final charge levels into the neighbor page so that its coupling effects are mostly compensated for during programming. This coordinated programming of neighboring pages allows the write operation to pre-compensate for potential write disturbs. The buffer discussed herein can be used to facilitate the pre-compensated write operation by storing a sufficient amount of data that allow the controller to "look forward" to data that will be programmed. The controller can then determine the appropriate levels of the "soft" programming that will bring the neighboring page close enough to the final charge levels so that the coupling that causes write disturb is significantly pre-compensated.

For example, consider a hypothetical NAND flash with four physically-adjacent pages: A, B, C, and D (A and D are edge pages with only one neighbor). A pre-compensated write operation would work as follows:
1. Gather data to be programmed for pages A and B.
2. Softly program page B.
3. Program page A to its final levels.
4. Gather data for page C.
5. Softly program page C.
6. Program page B to its final levels.
7. Gather data for page D.
8. Softly program page D.
9. Program page C to its final levels.
10. Program page D to its final levels.

Processes 1-10 above could be repeated twice, once for the lower pages, and once for the upper logical pages or could be applied to the only the upper pages.

In an alternative process, at some point in time prior to normal operation, the coupling of adjacent bit cells is characterized. This characterization used to determine coupling compensation coefficients which can be used in pre-compensating for write disturb effects. Depending upon variability of coupling, the quantity of coupling coefficients stored can be traded-off against the desired improvement in error rate.

In some designs, coupling coefficients can be determined and used to compensate for write disturb effects when programming bit cells multiple pages away (cells in pages to the sides of the bit cell) and multiple bit positions away (cells in the same page word line before and after) from the cell being programmed. Coupling coefficients can be determined dependent upon page number, for example, to mitigate die location effects.

In some implementation, during normal device operation, the write process operates as follows:
1. Gather the data to be stored for both a storage cell and any significantly-coupled nearby cells.
2. Until fully collected, accumulate and hold this data prior to storing in a final destination in the buffer.
3. While programming a page, compensate the level of each storage cell to mitigate the effects of the neighboring cells using the coupling coefficients and data.
4. Repeat until all data are stored.

The following hypothetical example illustrates a pre-compensated write operation according to some embodiments Assume a hypothetical NAND flash primary storage storing two bits/cell (four charge levels). Assume during manufacturing it is determined that adjacent pages cause a shift of 2% per cell level difference. Normalized cell charge levels are 0.95, 0.6, 0.3, and 0.05 Volts, corresponding to stored data bits of 11, 10, 01, and 00.

Assume cell 1 will be programmed to 01 (with the nominal level of 0.3). With no consideration of adjacent bit cells, the cell would be programmed to a charge level of 0.3.

Assume the adjacent yet-to-be programmed page contains an adjacent cell (cell 2) storing data 00. Instead of programming cell 1 to a level of 0.3, the following compensation calculation is performed:

$$\text{Compensation for the 00 adjacent page cell (cell 2)} = +(0.3*0.02) = 0.006$$

$$0.006(\text{compensation value}) + 0.3(\text{nominal value}) = 0.306(\text{new target value})$$

Thus, for cell 1 would be programmed to a charge level of 0.306 (instead of 0.3) to pre-compensate for the adjacent cell's (cell 2) future programming level.

In this implementation the compensation would likely only be done on the cells containing 10 and 01 values. Cells with 11 or 00 would always remain at the 0.95/0.05 values for best signal to noise ratio (SNR).

Note that the effects of already-programmed cells are also compensated for. Because these cells are already they are already programmed, their coupling effects would inherently be sensed and compensated for (post-compensation) while the cell is being programmed. The processed outlined above provides for both pre-compensation (e.g., adjusting programming voltage levels to compensate for write disturb effects potentially caused by cells that are not yet programmed) and post-compensation (adjusting programming voltage levels to compensate for write disturb effects potentially caused by previously programmed cells).

It is to be understood that this detailed description is illustrative only, and various additions and/or modifications may be made to these embodiments, especially in matters of structure and arrangements of parts and/or processes. Accordingly, the scope of the present disclosure should not be limited by the particular embodiments described above, but should be defined by the claims set forth below and equivalents thereof.

What is claimed is:

1. A method, comprising:
    receiving, in a data storage device, a write data command to store data in a primary memory of the data storage device;
    storing the data in a buffer of the storage device;
    after storing the data in the buffer, issuing a command complete status indication indicating that the write data command has been completed; and after issuing the command complete status indication, storing the data in the primary memory of the storage device, wherein the primary memory comprises a first type of non-volatile memory, the buffer comprises a second type of non-volatile memory that is different from the first type of non-volatile memory.

2. The method of claim 1, wherein the second type of non-volatile memory has faster access time than the first type of non-volatile memory.

3. The method of claim 1, wherein:
storing the data in the primary memory comprises storing the data in flash memory; and
storing the data in the buffer comprises storing the data in one or more of STRAM, PCRAM, RRAM, and NVS-RAM.

4. The method of claim 1, further comprising:
storing mapping metadata in the buffer, the mapping metadata including mapping information between the logical block addresses of the data and a physical location of the data in the primary memory; and
after issuing the command complete status indication, storing the mapping metadata in the primary memory.

5. The method of claim 1, further comprising:
accumulating data from multiple write data commands in the buffer until a threshold amount of data has been accumulated in the buffer; and
after the threshold amount of data has been accumulated in the buffer, storing accumulated data in the primary memory.

6. The method of claim 5, wherein:
the primary memory comprises flash memory; and
the threshold amount of accumulated data is one logical page of data.

7. The method of claim 5 wherein:
the primary memory comprises flash memory; and
the threshold amount of accumulated data is one physical page of data.

8. The method of claim 5 wherein the primary memory comprises multi-level flash memory and the threshold amount of accumulated data is sufficient to allow at least one page of accumulated data to be stored in the flash memory; and
further comprising:
reading one or more pages from each physical page in the at least one block of the primary memory where the at least one page is to be stored;
storing the other pages in the buffer; and
after the at least one page has been accumulated, storing the page and the other pages in the physical page of the primary memory.

9. The method of claim 8, wherein reading the other pages occurs before accumulating the page.

10. The method of claim 8, wherein reading the other pages occurs during accumulating the page.

11. The method of claim 1, further comprising:
counting numbers of times regions of logical blocks within the data storage device have been written;
accumulating data from multiple write data commands in the buffer; and
determining if regions of logical blocks are infrequently-written or frequently-written based on the numbers; and
storing data for the infrequently-written regions of logical blocks into primary memory before storing data for the frequently-written regions of logical blocks.

12. The method of claim 1, further comprising updating metadata that provides status of the write operation.

13. The method of claim 12, wherein updating the metadata comprises updating the metadata to indicate a write operation is in progress after the write data command is received.

14. The method of claim 12, wherein updating the metadata comprises updating the metadata to indicate that the data have been received.

15. The method of claim 12, wherein updating the metadata comprise updating the metadata to indicate that the write operation is complete after storing the data in the primary memory.

16. A device, comprising:
an interface configured to receive a write data command and data;
a primary memory comprising a first type of non-volatile memory, wherein the write data command is a write data command to store data in the primary memory;
a buffer comprising a second type of non-volatile memory different from the first type of non-volatile memory; and
a controller configured to:
cause the data to be stored in the buffer;
after the data are stored in the buffer, issue a command complete status indication indicating the write data command is complete; and
after the command complete status indication is issued, cause the data to be stored in the primary memory.

17. The device of claim 16, wherein the second memory type comprises one or more of non-volatile static random-access memory (NVSRAM), phase-change memory (PCM), resistive random-access memory (RRAM), spin-torque RAM (STRAM), and magnetic RAM (MRAM).

18. The device of claim 16, wherein the device comprises a solid state drive and the first memory type comprises flash memory.

19. The device of claim 16 wherein the device comprises a hybrid drive.

20. The device of claim 16 wherein the controller is configured to pre-compensate for write disturb effects when the data are stored in the primary memory.

* * * * *